(12) United States Patent
Ohmaru

(10) Patent No.: US 9,083,327 B2
(45) Date of Patent: Jul. 14, 2015

(54) SEMICONDUCTOR DEVICE AND METHOD OF DRIVING SEMICONDUCTOR DEVICE

(71) Applicant: Semiconductor Energy Laboratory Co., Ltd., Atsugi-shi, Kanagawa-ken (JP)

(72) Inventor: Takuro Ohmaru, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 56 days.

(21) Appl. No.: 13/928,555

(22) Filed: Jun. 27, 2013

(65) Prior Publication Data

US 2014/0009198 A1    Jan. 9, 2014

(30) Foreign Application Priority Data

Jul. 6, 2012    (JP) ................. 2012-152338

(51) Int. Cl.
| | |
|---|---|
| *G11C 19/00* | (2006.01) |
| *H03K 3/356* | (2006.01) |
| *H03K 3/012* | (2006.01) |
| *H03K 3/037* | (2006.01) |
| *H01L 21/8258* | (2006.01) |
| *H01L 27/06* | (2006.01) |
| *H01L 27/088* | (2006.01) |
| *G11C 5/14* | (2006.01) |

(Continued)

(52) U.S. Cl.
CPC .......... *H03K 3/356008* (2013.01); *G11C 5/148* (2013.01); *G11C 11/401* (2013.01); *H01L 21/8258* (2013.01); *H01L 27/0688* (2013.01); *H01L 27/088* (2013.01); *H01L 27/1225* (2013.01); *H03K 3/012* (2013.01); *H03K 3/0375* (2013.01)

(58) Field of Classification Search
None
See application file for complete search history.

(56) References Cited

U.S. PATENT DOCUMENTS

| | | | |
|---|---|---|---|
| 5,218,607 A | | 6/1993 | Saito et al. |
| 5,378,912 A | * | 1/1995 | Pein ........................ 257/335 |
| 5,498,988 A | * | 3/1996 | Reyes et al. ............. 327/199 |

(Continued)

FOREIGN PATENT DOCUMENTS

| | | |
|---|---|---|
| EP | 0 404 061 A2 | 12/1990 |
| EP | 0 818 891 A2 | 1/1998 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Tuan T Lam
(74) *Attorney, Agent, or Firm* — Fish & Richardson P.C.

(57) ABSTRACT

A novel semiconductor device and a method of driving the semiconductor device. A (volatile) node in which data that is rewritten as appropriate by arithmetic processing is held and a node in which the data is stored are electrically connected to each other via a source and a drain of a transistor in which a channel is formed in an oxide semiconductor layer. Then, data and data obtained by inverting the data (inverted data) are stored before supply of power source voltage is stopped, and the two inputs (data) are compared after restart of supply of the power source voltage, so that data obtained by arithmetic processing just before the supply of the power source voltage is stopped is restored.

7 Claims, 5 Drawing Sheets

(51) Int. Cl.
*G11C 11/401* (2006.01)
*H01L 27/12* (2006.01)

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,936,879 | A | 8/1999 | Brouwer et al. |
| 6,046,606 | A | 4/2000 | Chu et al. |
| 6,294,274 | B1 | 9/2001 | Kawazoe et al. |
| 6,563,174 | B2 | 5/2003 | Kawasaki et al. |
| 6,639,827 | B2 * | 10/2003 | Clark et al. .................. 365/154 |
| 6,727,522 | B1 | 4/2004 | Kawasaki et al. |
| 6,775,180 | B2 * | 8/2004 | Biyani et al. .................. 365/154 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,612,594 | B2 | 11/2009 | Fukuoka |
| 7,626,434 | B2 * | 12/2009 | Aksamit ........................ 327/202 |
| 7,674,650 | B2 | 3/2010 | Akimoto et al. |
| 7,732,819 | B2 | 6/2010 | Akimoto et al. |
| 8,053,836 | B2 * | 11/2011 | Yeh et al. ...................... 257/345 |
| 8,115,201 | B2 | 2/2012 | Yamazaki et al. |
| 8,188,477 | B2 * | 5/2012 | Miyairi et al. .................. 257/59 |
| 8,362,478 | B2 | 1/2013 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0051574 | A1 * | 3/2004 | Ko et al. ....................... 327/218 |
| 2004/0090256 | A1 * | 5/2004 | Cho ............................... 327/202 |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0119406 | A1 * | 6/2006 | Henzler et al. ................. 327/208 |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0085585 | A1 * | 4/2007 | Frederick ....................... 327/218 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0218234 | A1 * | 9/2008 | Jain ................................ 327/202 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0315932 | A1 * | 12/2008 | Tower et al. .................. 327/202 |
| 2009/0068773 | A1 | 3/2009 | Lai et al. |
| 2009/0073325 | A1 | 3/2009 | Kuwabara et al. |
| 2009/0108896 | A1 * | 4/2009 | Yasuda et al. ................. 327/202 |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0189664 | A1 * | 7/2009 | Remington ..................... 327/202 |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0252832 | A1 | 10/2010 | Asano et al. |
| 2011/0248759 | A1 * | 10/2011 | Chi et al. ....................... 327/202 |
| 2012/0132910 | A1 | 5/2012 | Yamazaki et al. |
| 2012/0170355 | A1 | 7/2012 | Ohmaru et al. |
| 2012/0229187 | A1 * | 9/2012 | Choudhury et al. ........... 327/202 |
| 2013/0222033 | A1 * | 8/2013 | Kato et al. ..................... 327/214 |
| 2013/0229218 | A1 * | 9/2013 | Nishijima ...................... 327/207 |
| 2013/0242639 | A1 * | 9/2013 | Koyama ........................ 365/148 |
| 2014/0009199 | A1 * | 1/2014 | Ohmaru et al. ............... 327/198 |
| 2014/0126271 | A1 * | 5/2014 | Aoki et al. .................... 365/149 |

FOREIGN PATENT DOCUMENTS

| | | |
|---|---|---|
| EP | 0 936 546 A2 | 8/1999 |
| EP | 1 737 044 A1 | 12/2006 |
| EP | 2 226 847 A2 | 9/2010 |
| JP | 58-205226 A | 11/1983 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-027419 A | 2/1991 |
| JP | 05-251705 A | 9/1993 |
| JP | 08-264794 A | 10/1996 |
| JP | 10-078836 A | 3/1998 |
| JP | 10-093423 A | 4/1998 |
| JP | 11-505377 A | 5/1999 |
| JP | 11-261406 A | 9/1999 |
| JP | 2000-044236 A | 2/2000 |
| JP | 2000-077982 A | 3/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| JP | 2008-052847 A | 3/2008 |
| JP | 2010-062229 A | 3/2010 |
| JP | 2010-062546 A | 3/2010 |
| JP | 2010-258434 A | 11/2010 |
| JP | 2010-267955 A | 11/2010 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTs) for AMLCDS," Journal of the SID , 2007, vol. 15, No. 1, pp. 17-22.

(56) References Cited

OTHER PUBLICATIONS

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White TANDEM OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; AGNE Gijutsu Center, with English translation.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Kiyoshi Kato et al.; "Evaluation of Off-State Current Characteristics of Transistor Using Oxide Semiconductor Material, Indium—Gallium—Zinc Oxide"; Jpn. J. Appl. Phys.; 51 (2012); pp. 021201-1-021201-7.

Hiroki Inoue et al.; "Nonvolatile Memory With Extremely Low-Leakage Indium—Gallium—Zinc—Oxide Thin-Film Transistor"; IEEE Journal of Solid-State Circuits, vol. 47, No. 9; Sep. 2012; pp. 2258-2265.

(56) References Cited

OTHER PUBLICATIONS

Shunpei Yamazaki et al.; "Research, Development, and Application of Crystalline Oxide Semiconductor"; SID 2012 Digest; 2012; pp. 183-186.

Kobayashi.H et al., "Processor with 4.9-µs break-even time in power gating using crystalline In—Ga—Zn—oxide transistor", Cool Chips XVI, Apr. 17, 2013, pp. 1-3.

Kitagawa.E et al., "Impact of ultra low power and fast write operation of advanced perpendicular MTJ on power reduction for high-performance mobile CPU", IEDM 12: Technical Digest of International Electron Devices Meeting, Dec. 10, 2012, pp. 677-680.

Bartling.S et al., "An 8MHz 75µA/MHz Zero-Leakage Non-Volatile Logic-Based Cortex-M0 MCU SoC Exhibiting 100% Digital State Retention at VDD=0V with <400ns Wakeup and Sleep Transitions", ISSCC 2013 (Digest of Technical Papers, IEEE International Solid-State Circuits Conference), Feb. 17, 2013, pp. 432-433.

Sjokvist.N et al., "State retention flip flop architectures with different tradeoffs using crystalline indium gallium zinc oxide transistors implemented in a 32-bit normally-off microprocessor", Jpn. J. Appl. Phys. (Japanese Journal of Applied Physics), 2014, vol. 53, pp. 04EE10-1-04EE10-6.

Tamura.H et al., "Embedded SRAM and Cortex-M0 Core with Backup Circuits Using a 60-nm Crystalline Oxide Semiconductor for Power Gating", IEEE Cool Chips XVII, Apr. 14, 2014, p. 3pages.

* cited by examiner

SEMICONDUCTOR DEVICE AND METHOD OF DRIVING SEMICONDUCTOR DEVICE

BACKGROUND OF THE INVENTION

1. Field of the Invention

The present invention relates to a semiconductor device. In particular, the present invention relates to a semiconductor device to which power supply is stopped as appropriate during its operation. Further, the present invention relates to a driving method of the semiconductor device. Note that in this specification, a semiconductor device refers to a device which is capable of functioning by utilizing semiconductor characteristics.

2. Description of the Related Art

A semiconductor device such as a central processing unit (CPU) has a variety of configurations depending on its application. The semiconductor device generally has some kinds of memory devices such as a register and a cache memory as well as a main memory for storing data or a program. A register has a function of temporarily holding data for carrying out arithmetic processing, holding a program execution state, or the like. In addition, a cache memory is located between an arithmetic circuit and a low-speed main memory in order to reduce access to the main memory and speed up the arithmetic processing.

A register and a cache memory need to operate at higher speed in reading or writing data than a main memory. Thus, in many cases, a flip-flop is used as a register, and a static random access memory (SRAM) is used as a cache memory.

In order to reduce power consumption, supply of power source voltage to a semiconductor device is preferably stopped as appropriate (for example, in a period during which data is not input or output). Note that a flip-flop, an SRAM, and the like are volatile memory devices. Therefore, in the case where supply of power source voltage to a semiconductor device is stopped, data which has been lost in a volatile memory device such as a register or a cache memory needs to be restored after the supply of power source voltage is restarted. For example, the following process is necessary: needed data is read from an auxiliary memory device provided in the outside of the semiconductor device to be newly written to the volatile memory device in a signal processing circuit. This leads to operating delay of the signal processing circuit.

In view of this, a semiconductor device in which a nonvolatile memory device is located in the periphery of a volatile memory device has been developed. For example, Patent Document 1 discloses the following technique: data held in a flip-flop or the like is stored in a ferroelectric memory before supply of power source voltage is stopped, and the data stored in the ferroelectric memory is restored to the flip-flop or the like after the supply of power source voltage is restarted.

REFERENCE

Patent Document

[Patent Document 1] Japanese Published Patent Application No. H10-078836

SUMMARY OF THE INVENTION

An object of one embodiment of the present invention is to provide a novel semiconductor device and a driving method thereof. Specifically, an object is to provide a semiconductor device such as a central processing unit whose power consumption can be reduced and operating delay can be prevented.

In a semiconductor device of one embodiment of the present invention, a (volatile) node which holds data that is rewritten by arithmetic processing as appropriate and a node in which the data is stored (moved) are electrically connected to each other through a source and a drain of a transistor whose channel is formed in an oxide semiconductor layer. Note that the off-state current value of the transistor is extremely low. For that reason, electric charge scarcely leaks through the transistor from the latter node. As a result, data can be held in the latter node even in a period during which supply of power source voltage is stopped. Note that in this specification, stopping supply of power source voltage means not supplying the power source voltage (high power source potential or low power source potential) or making the power source voltage (a potential difference between the high power source potential and the low power source potential) zero or substantially zero.

In the semiconductor device, data (first data) and data (first data) obtained by inverting the data (inverted data or second data) are stored (moved) before supply of power source voltage is stopped, and both data are compared with each other after the supply of power source voltage is restored, so that data (first data) obtained by arithmetic processing just before the supply of power source voltage is stopped can be restored.

For example, one embodiment of the present invention is a semiconductor device including a first node in which a potential corresponding to one of 1 and 0 can be held as data in a period in which a power source voltage is supplied; a second node in which a potential corresponding to the other of 1 and 0 can be held as inverted data in the period in which the power source voltage is supplied; a third node in which the data can be held regardless of whether the power source voltage is supplied or not; a fourth node in which the inverted data can be held regardless of whether the power source voltage is supplied or not; a first transistor capable of controlling electrical connection between the first node and the third node, the first transistor including a channel in an oxide semiconductor layer; a second transistor capable of controlling electrical connection between the second node and the fourth node, the second transistor including a channel in an oxide semiconductor layer; and a comparator to which a potential of the third node is input as a first input signal and a potential of the fourth node is input as a second input signal.

Another embodiment of the present invention is a method of driving the semiconductor device, including a first step of turning on the first transistor to store the data, which is held in the first node, in the third node and turning on the second transistor to store the inverted data, which is held in the second node, in the fourth node; a second step of stopping supply of the power source voltage after the first step; a third step of restarting the supply of the power source voltage after the second step; and a fourth step of restoring the data in the first node and the inverted data in the second node which are held before the second step, in accordance with an output signal of the comparator after the third step.

Supply of power source voltage to a semiconductor device of one embodiment of the present invention is stopped as appropriate, so that the power consumption of the semiconductor device can be reduced. Further, data is stored before the supply of power source voltage is stopped and is restored after the supply of power source voltage is restarted, so that operating delay can be prevented.

DETAILED DESCRIPTION OF THE INVENTION

Embodiments of the present invention will be described below in detail. Note that the present invention is not limited to the description below, and a variety of changes can be made without departing from the spirit and scope of the present invention. Therefore, the present invention should not be construed as being limited to the description below.

<Structural Example of Semiconductor Device and Example of Driving Method Thereof>

Figure 1A:
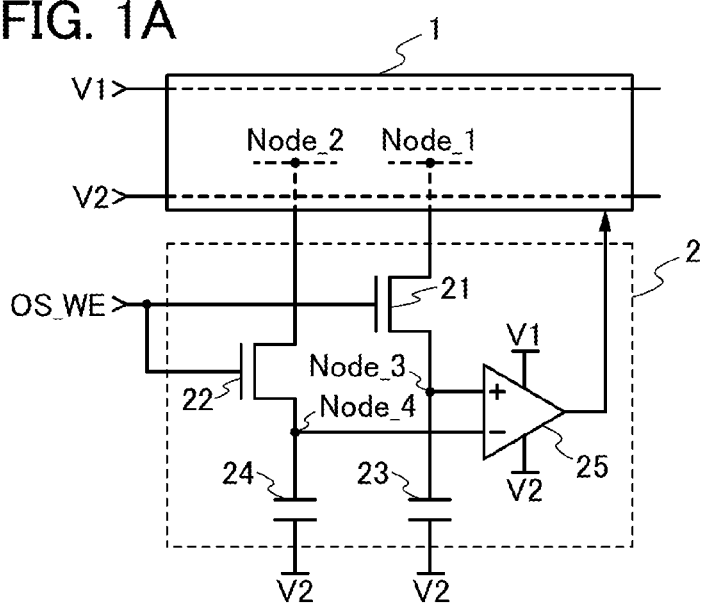
FIG. 1A illustrates a configuration example of a semiconductor device.
Figure 1B:
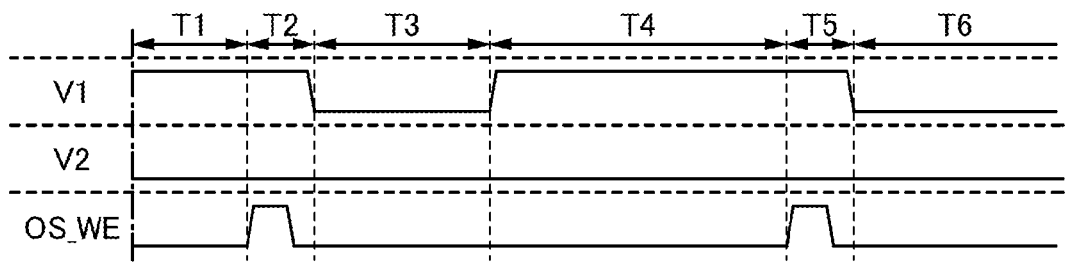
FIG. 1B is a timing diagram showing an example of potentials and signals supplied to the semiconductor device.

FIG. 1A illustrates an example of a structure of a semiconductor device of one embodiment of the present invention. FIG. 1B shows an example of a timing diagram of a power source potential V1, a power source potential V2, and a signal OS_WE which are supplied to the semiconductor device illustrated in FIG. 1A.

The semiconductor device illustrated in FIG. 1A includes an arithmetic portion 1 that performs arithmetic processing and a data storing portion 2 where data held in the arithmetic portion 1 is stored.

The arithmetic portion 1 is supplied with the power source potential V1 and the power source potential V2. The arithmetic portion 1 can operate using a difference between the power source potentials V1 and V2 as a power source voltage. Note that here, the power source potential V1 is a high power source potential VDD or a low power source potential VSS, and the power source potential V2 is a low power source potential VSS. The arithmetic portion 1 has a node (Node_1) in which a potential corresponding to one of 1 and 0 can be held as data and a node (Node_2) in which a potential corresponding to the other of 1 and 0 can be held as data (inverted data) during periods T1 and T4 in which the power source voltage is supplied (the power source potential V1 is the high power source potential VDD).

The data storing portion 2 includes a transistor 21, a transistor 22, a capacitor 23, a capacitor 24, and a comparator 25. A gate, one of a source and a drain, and the other of the source and the drain of the transistor 21 are electrically connected to a wiring for supplying the signal OS_WE, the node (Node_1) in the arithmetic portion 1, and a node (Node_3), respectively. A gate, one of a source and a drain, and the other of the source and the drain of the transistor 22 are electrically connected to the wiring for supplying a signal OS_WE, the node (Node_2) in the arithmetic portion 1, and a node (Node_4), respectively. One of electrodes and the other of the electrodes of the capacitor 23 are electrically connected to the node (Node_3) and a wiring for supplying the power source potential V2, respectively. One of electrodes and the other of the electrodes of the capacitor 24 are electrically connected to the node (Node_4) and the wiring for supplying the power source potential V2, respectively. A non-inverting input terminal and an inverting input terminal of the comparator 25 are electrically connected to the node (Node_3) and the node (Node_4), respectively. An output terminal of the comparator 25 is electrically connected to the arithmetic portion 1. Note that in the data storing portion 2 illustrated in FIG. 1A, the capacitors 23 and 24 can be omitted. In the semiconductor device illustrated in FIG. 1A, a potential of the node (Node_3) is a potential of the source or the drain of the transistor 21 which is electrically connected the node (Node_3), and a potential of the node (Node_4) is a potential of the source or the drain of the transistor 22 which is electrically connected to the node (Node_4)

Here, the potential of the signal OS_WE is higher than the sum of the threshold voltages of the transistors 21 and 22 and the high power source potential VDD when the signal OS_WE is at high level, and the potential of the signal OS_WE is the low power source potential VSS when the signal OS_WE is at low level (this case is referred to as a former case). Note that the potential of the signal OS_WE can alternatively be the high power source potential VDD when the signal OS_WE is at high level and can be the low power source potential VSS when the signal OS_WE is at low level (this case is referred to as a latter case). In the latter case, the power source potential needed for driving the semiconductor device can be reduced as compared with the former case. On the other hand, in the former case, the high power source potential VDD can be supplied to the node (Node_3) and the node (Node_4), so that data storing described later can be performed surely.

Note that in the transistors 21 and 22, a channel is formed in an oxide semiconductor layer. A path for supplying charges to the node (Node_3) is only a path through the source and the drain of the transistor 21. A path for supplying charges to the node (Node_4) is only a path through the source and the drain of the transistor 22. A transistor in which a channel is formed in an oxide semiconductor layer has an extremely low off-state current. Therefore, in a period in which the transistors 21 and 22 are off, the potentials of the nodes (Node_3) and (Node_4) can be kept substantially constant. For this reason, data can be held in the nodes (Node_3) and (Node_4) regardless of whether the power source voltage is supplied or not. In other words, data held in the node (Node_1) in the arithmetic portion 1 can be stored in the node (Node_3); data (inverted data) held in the node (Node_2) in the arithmetic portion 1 can be stored in the node (Node_4).

The comparator 25 is supplied with the power source potential V1 and the power source potential V2, and can operate using a potential difference therebetween as a power source voltage. Specifically, in the case where the potential of the node (Node_3) is higher than the potential of the node (Node_4), the comparator 25 outputs the power source potential V1 to the arithmetic portion 1; in the case where the potential of the node (Node_3) is lower than the potential of the node (Node_4), the comparator 25 outputs the power source potential V2 to the arithmetic portion 1. Note that in the data storing portion 2 illustrated in FIG. 1A, a potential different from the power source potentials V1 and V2 can be supplied to the comparator 25. For example, the power source potential V2 and a power source potential V3 that is lower than the power source potential V1 and higher than the power source potential V2 can be supplied to the comparator.

Thus, in the arithmetic portion 1, data lost due to stop of supply of the power source voltage, which have been held in the nodes (Node_1) and (Node_2) in the arithmetic portion 1, can be restored in accordance with an output signal of the comparator 25.

In the semiconductor device illustrated in FIG. 1A, power consumption can be reduced by stop of supply of the power source voltage (in periods T3 and T6 in FIG. 1B). Furthermore, before the stop of supply of the power source voltage, data held in the node (Node_1) is stored in the node (Node_3) and data held in the node (Node_2) is stored in the node (Node_4) (in periods T2 and T5 in FIG. 1B), so that data which have been held in the nodes (Node_1) and (Node_2) can be restored in accordance with the output signal of the comparator 25, after restart of supply of the power source voltage. Thus, operating delay can be prevented in the semiconductor device illustrated in FIG. 1A.

Moreover, in the semiconductor device illustrated in FIG. 1A, data restoring in the arithmetic portion 1 is performed in accordance with two inputs (data) (the potential of the node (Node_3) and the potential of the node (Node_4)). In this case, the period of time for data restoring can be shortened as compared with a semiconductor device in which data restoring in the arithmetic portion 1 is performed in accordance with one input. This point is described below in detail.

Data storing in the semiconductor device illustrated in FIG. 1A is performed in such a manner that the potential of the node (Node_3) is set to a potential corresponding to data held in the node (Node_1), and the potential of the node (Node_4) is set to a potential corresponding to inverted data held in the node (Node_2). For example, the potential of the node (Node_3) is changed from a potential corresponding to 0 to a potential corresponding to 1, and the potential of the node (Node_4) is changed from a potential corresponding to 1 to a potential corresponding to 0.

The same applies to a semiconductor device in which data restoring in the arithmetic portion 1 is performed in accordance with one input. That is, data storing in the semiconductor device is performed in such a manner that the potential at a certain node is changed from a potential corresponding to 0 to a potential corresponding to 1, or the potential of the node is changed from the potential corresponding to 1 to the potential corresponding to 0.

Here, the period of time for changing the potential corresponding to 0 to the potential corresponding to 1 is not always the same as the period of time for changing the potential corresponding to 1 to the potential corresponding to 0. For example, in the case where data held in the node is determined in accordance with the conduction state of a transistor a gate of which is electrically connected to the node, whether the data held in the node is identified as 1 or 0 depends on the threshold voltage of the transistor. Specifically, when the threshold voltage of the transistor is closer to the potential corresponding to 0 than to the potential corresponding to 1, the period of time for changing the potential corresponding to 1 to the potential corresponding to 0 becomes longer than the period of time for changing the potential corresponding to 0 to the potential corresponding to 1. In such a case, the period of time for changing the potential corresponding to 1 to the potential corresponding to 0 (a longer period of time) is used as the reference for setting a period of time of data storing in order to store data surely.

On the other hand, in the semiconductor device illustrated in FIG. 1A, data restoring is performed in accordance with an output signal of the comparator 25 that directly compares the potential of the node (Node_3) and the potential of the node (Node_4). In this case, the period of time for changing the output signal of the comparator 25 from the potential corresponding to 0 to the potential corresponding to 1 is the same as the period of time for changing the output signal of the comparator 25 from the potential corresponding to 1 to the potential corresponding to 0. In other words, in the semiconductor device illustrated in FIG. 1A, the longer period of time of data storing does not to be used as the reference in setting the period of time of data storing. Accordingly, operating delay in the semiconductor device illustrated in FIG. 1A can be prevented.

<Example of Data Restoring in Arithmetic Portion 1>

Figure 2A:
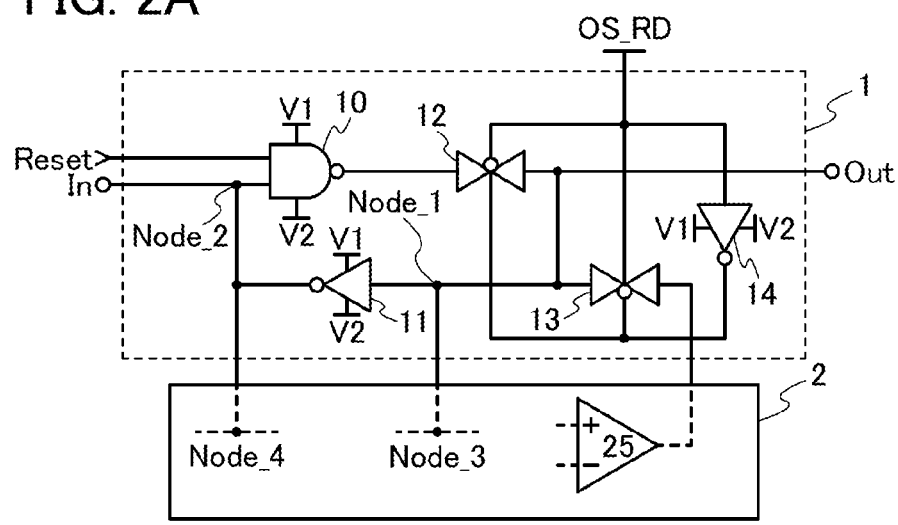
FIG. 2A illustrates a configuration example of an arithmetic portion and FIG. 2B is a timing diagram showing an example of potentials and signals supplied to the arithmetic portion.
Figure 2B:
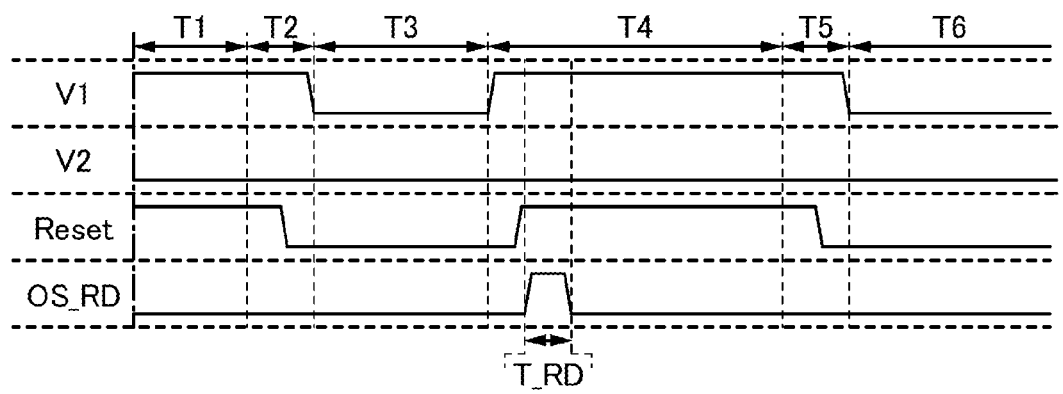

FIG. 2A illustrates a configuration example of the arithmetic portion 1 included in the semiconductor device illustrated in FIG. 1A. FIG. 2B is an example of a timing diagram showing the power source potentials V1 and V2, a signal Reset, and a signal OS_RD which are supplied to a semiconductor device illustrated in FIG. 2A. Note that here, the potentials of the signal Reset and the signal OS_RD are each a high power source potential VDD or a low power source potential VSS.

The arithmetic portion 1 illustrated in FIG. 2A includes a NAND gate 10 having one input terminal to which the signal Reset is input, an inverter 11 that has an input terminal to which an output signal of the NAND gate 10 or the output signal of the comparator 25 in the data storing portion 2 is input and that outputs a signal to the other input terminal of the NAND gate 10, an analog switch 12 that controls electrical connection between an output terminal of the NAND gate 10 and the input terminal of the inverter 11, and an analog switch 13 that controls electrical connection between an output terminal of the comparator 25 in the data storing portion 2 and the input terminal of the inverter 11.

Note that in the semiconductor device illustrated in FIG. 2A, a node to which an input terminal (In) of the arithmetic portion 1, the other input terminal of the NAND gate 10, and the output terminal of the inverter 11 are electrically connected corresponds to the node (Node_2) illustrated in FIG. 1A. A node where an output terminal (Out) of the arithmetic portion 1 and the output terminal of the inverter 11 are electrically connected corresponds to the node (Node_1) illustrated in FIG. 1A.

The analog switches 12 and 13 operate reversely by the signal OS_RD and an inverted signal of the signal OS_RD (an output signal of an inverter 14). In other words, in the semiconductor device illustrated in FIG. 2A, the analog switches 12 and 13 and the inverter 14 form a switch.

In the arithmetic portion 1 illustrated in FIG. 2A, after restart of supply of the power source voltage, in a period (a period T_RD in FIG. 2B) in which the potential of the signal Reset is the high power source potential VDD and the potential of the potential of the signal OS_RD is the high power source potential VDD, data in the node (Node_1) and the node (Node_2) can be restored.

<Example of Transistor whose Channel is Formed in Oxide Semiconductor Layer>

Figure 3:
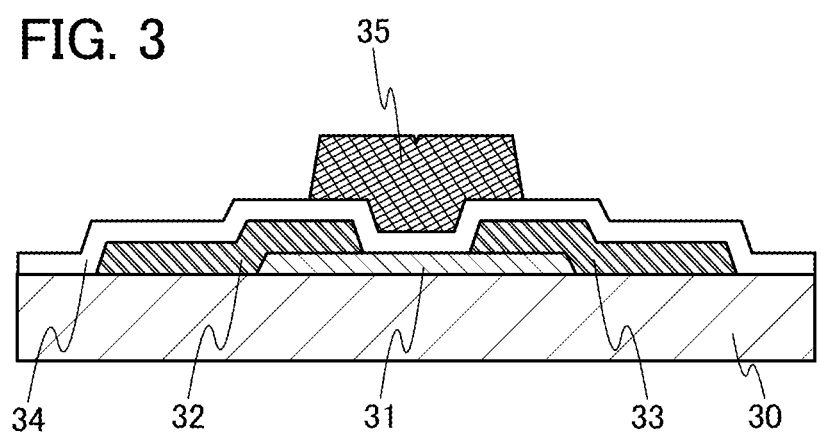
FIG. 3 illustrates an example of a structure of a transistor.

FIG. 3 illustrates an example of a structure of a transistor in which a channel is formed in an oxide semiconductor layer. The transistor illustrated in FIG. 3 includes an oxide semiconductor layer 31 provided over a layer 30 having an insulating surface, a conductive layer 32 in contact with one end of the oxide semiconductor layer 31, a conductive layer 33 in contact with the other end of the oxide semiconductor layer 31, an insulating layer 34 provided over the oxide semiconductor layer 31 and the conductive layers 32 and 33, and a conductive layer 35 provided over the insulating layer 34. Note that in the transistor illustrated in FIG. 3, the conductive layers 32 and 33 function as a source and a drain, the insulating layer 34 functions as a gate insulating film, and the conductive layer 35 functions as a gate.

<1. Specific Example of Oxide Semiconductor Layer 31>
<(1) Oxide Semiconductor Material>

A film containing at least indium can be used as the oxide semiconductor layer 31. In particular, a film containing indium and zinc is preferably used. As a stabilizer for reducing variations in electric characteristics of the transistor, a film containing gallium (Ga) in addition to indium and zinc is preferably used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor layer 31.

As the oxide semiconductor layer 31, for example, a film of any of the following oxides can be used: indium oxide; a two-component metal oxide such as an In—Zn-based oxide, an In—Mg-based oxide, or an In—Ga-based oxide; a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Note that part of oxygen included in the oxide semiconductor layer 31 may be substituted with nitrogen.

<(2) Crystal Structure of Oxide Semiconductor>

For the oxide semiconductor layer 31, a film having a single crystal state, a polycrystalline (also referred to as polycrystal) state, an amorphous state, or the like can be used. In addition, a CAAC-OS (c-axis aligned crystalline oxide semiconductor) film can be used for the oxide semiconductor layer 31. The CAAC-OS film is described in detail below.

The CAAC-OS film is one of oxide semiconductor films including a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

In the CAAC-OS film, distribution of c-axis aligned crystal parts is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity means an element other than main components of the oxide semiconductor film, such as hydrogen, carbon, silicon, or a transition metal element. In particular, an element (e.g., silicon) having higher strength of bonding to oxygen than a metal element included in the oxide semiconductor film takes oxygen away in the oxide semiconductor film to disrupt the atomic arrangement in the oxide semiconductor film, which causes a lowering of the crystallinity of the oxide semiconductor film. A heavy metal such as iron or nickel, argon, carbon dioxide, or the like has a large atomic radius (or molecular radius), and thus disrupts the atomic arrangement in the oxide semiconductor film when included in the oxide semiconductor film, which causes a lowering of the crystallinity of the oxide semiconductor film. Note that the impurity included in the oxide semiconductor film serves as a carrier trap or a carrier generation source in some cases.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor including the oxide semiconductor film rarely has a negative threshold voltage (rarely has normally-on characteristics). A highly purified intrinsic or substantially highly purified intrinsic oxide semiconductor film has few carrier traps. Thus, the transistor including the oxide semiconductor film has a small variation in electric characteristics and accordingly has high reliability. Charges trapped by the carrier traps in the oxide semiconductor film take a long time to be released and may behave like fixed charges. Thus, the transistor including the oxide semiconductor film with a high impurity concentration and a high density of defect states has unstable electric characteristics in some cases.

In a transistor using the CAAC-OS film, change in electric characteristics due to irradiation with visible light or ultraviolet light is small.

Note that the oxide semiconductor layer 31 may be a stacked film including two or more films of an amorphous oxide semiconductor film, a microcrystalline oxide semiconductor film, and a CAAC-OS film, for example.

<(3) Layer Structure of Oxide Semiconductor>

For the oxide semiconductor layer 31, not only a single-layer oxide semiconductor film but also a layer formed of a stack having plural kinds of oxide semiconductor films may be used. For example, a layer including at least two of an amorphous oxide semiconductor film, a polycrystalline oxide semiconductor film, and a CAAC-OS film can be used for the oxide semiconductor layer 31.

Alternatively, a layer formed of a stack of oxide semiconductor films having different compositions can be used for the oxide semiconductor layer 31. Specifically, a layer including a first oxide semiconductor film (hereinafter also referred to as an upper layer) which is provided on the insulating layer 34 side and a second oxide semiconductor film (hereinafter also referred to as a lower layer) which is provided on the layer 30 having an insulating surface side and has a different composition from the first oxide semiconductor film can be used as the oxide semiconductor layer 31.

<2. Specific Example of Conductive layers 32 and 33>

For the conductive layer 32 and the conductive layer 33, a film containing an element selected from aluminum, copper, titanium, tantalum, tungsten, molybdenum, chromium, neodymium, and scandium, a film of an alloy containing any of these elements, a film of a nitride containing any of these elements, or the like can be used. Alternatively, each of the conductive layer 32 and the conductive layer 33 can be formed with a stack of these films.

<3. Specific Example of Insulating Layer 34>

For the insulating layer 34, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of layers of these materials can also be used. In particular, an aluminum oxide film is preferably used for the insulating layer 34. The aluminum oxide film has a high shielding (blocking) effect of preventing penetration of both oxygen and an impurity such as hydrogen. Therefore, when the layer including an aluminum oxide film is used as the insulating layer 34, it is possible to prevent release of oxygen from the oxide semiconductor layer 31 and entry of an impurity such as hydrogen to the oxide semiconductor layer 31.

The insulating layer 34 can be formed using a film including a hafnium oxide film, an yttrium oxide film, a hafnium silicate (HfSi$_x$O$_y$(x>0, y>0)) film, a hafnium silicate film to which nitrogen is added, a hafnium aluminate (HfAl$_x$O$_y$(x>0, y>0)) film, a lanthanum oxide film (i.e., a film formed of what is called a high-k material), or the like. By using such a film, gate leakage current can be reduced.

<4. Specific Example of Conductive Layer 35>

For the conductive layer 35, a film containing an element selected from aluminum, copper, titanium, tantalum, tungsten, molybdenum, chromium, neodymium, and scandium or a film of an alloy containing any of these elements as its component can be used. Alternatively, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used for the conductive layer 35. Such a nitride film has a work function of 5 eV (electron volts) or higher, preferably 5.5 eV (electron volts) or higher, which enables the threshold voltage of the transistor to be positive when such a nitride film is used as the gate, so that what is called a normally-off switching element can be achieved. Alternatively, the conductive layer 35 can be formed with a stack of these films.

<5. Supplementary Note>

In the transistor illustrated in FIG. 3, it is preferred to suppress entry of impurities into the oxide semiconductor layer 31 and release of constituent element of the oxide semiconductor layer 31. This is because the electric characteristics of the transistor are changed when such a phenomenon occurs. As a means of suppressing this phenomenon, insulating layers having a high blocking effect are provided above and below the transistor (between the layer 30 having an insulating surface and the transistor, and over the insulating layer 34 and the conductive layer 35). For the insulating layers, for example, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of layers of these materials can also be used.

Example 1

Figure 4:
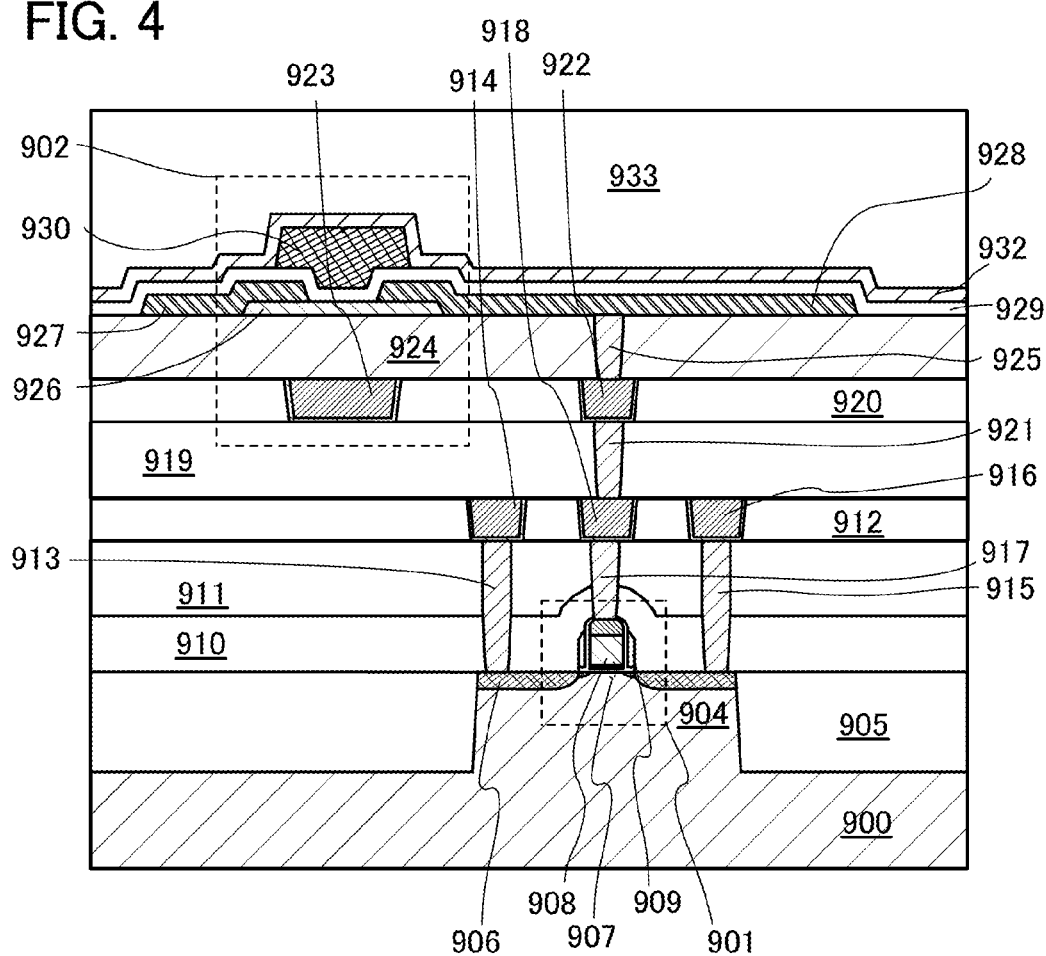
FIG. 4 illustrates an example of a structure of a semiconductor device.

In this example, referring to FIG. 4, description is made of examples of a structure and a manufacturing method of a semiconductor device including a transistor 902 in which a channel is formed in an oxide semiconductor layer and a transistor 901 in which a channel is formed in a single crystal silicon wafer. Note that the transistor 902 can be used as the transistors 21 and 22 illustrated in FIG. 1A, and the transistor 901 can be used as a transistor included in the comparator 25 illustrated in FIG. 1A, for example.

Note that a semiconductor material such as germanium, silicon germanium, or single crystal silicon carbide as well as silicon may be used for the transistor 901. A transistor including silicon can be formed using a silicon thin film formed by an SOI method or a silicon thin film formed by vapor deposition, for example; in this case, a glass substrate formed by a fusion process or a float process, a quartz substrate, a semiconductor substrate, a ceramic substrate, or the like can be used as a substrate. In the case where a glass substrate is used and the temperature of heat treatment to be performed later is high, it is preferable to use a glass substrate with a strain point of 730° C. or higher.

In the semiconductor device illustrated in FIG. 4, the transistor 901 using a single crystal silicon wafer is formed, and the transistor 902 using an oxide semiconductor is formed above the transistor 901. In other words, the semiconductor device described in this example is a semiconductor device that has a three-dimensional layered structure in which a silicon wafer is used as a substrate and a transistor layer is provided above the silicon wafer. Moreover, the semiconductor device in this example is a hybrid semiconductor device including a transistor in which silicon is used for a channel formation region and a transistor in which an oxide semiconductor is used for a channel formation region.

The transistor 901 formed using a substrate 900 containing a semiconductor material can be either an n-channel transistor (nMOSFET) or a p-channel transistor (pMOSFET). In the example illustrated in FIG. 4, the transistor 901 is electrically isolated from other elements by a shallow trench isolation (STI) 905. The use of the STI 905 can reduce generation of a bird's beak, which is caused by a LOCOS element isolation method, in an element isolation region and can reduce the size of the element isolation region. On the other hand, in a semiconductor device that is not required to be structurally miniaturized or downsized, the STI 905 is not necessarily formed and an element isolation means such as LOCOS can be used. In the substrate 900 where the transistor 901 is formed, a well 904 to which an impurity imparting conductivity, such as boron, phosphorus, or arsenic, is added is formed.

The transistor 901 in FIG. 4 includes a channel formation region in the substrate 900, impurity regions 906 (also referred to as a source region and a drain region) provided such that the channel formation region is placed therebetween, a gate insulating film 907 over the channel formation region, and a gate electrode layer 908 provided over the gate insulating film 907 to overlap the channel formation region. The gate electrode layer 908 can have a stacked structure of a gate electrode layer including a first material for increasing processing accuracy and a gate electrode layer including a second material for decreasing the resistance as a wiring. For example, the gate electrode layer can have a stacked structure of crystalline silicon to which an impurity imparting conductivity, such as phosphorus, is added and nickel silicide. Note that the structure is not limited to this, and materials, the number of stacked layers, the shape, or the like can be adjusted as appropriate depending on required specifications.

Note that the transistor 901 illustrated in FIG. 4 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film placed between the gate electrode layer and the protrusion. With the second transistor having a fin-type structure, the channel width can be reduced to achieve higher integration of transistors. Moreover, a larger amount of current can flow through the transistor and the control efficiency can be increased, so that the off-state current and threshold voltage of the transistor can be reduced.

Contact plugs 913 and 915 are connected to the impurity regions 906 in the substrate 900. Here, the contact plugs 913 and 915 also function as a source electrode and a drain electrode of the transistor 901. In addition, impurity regions that are different from the impurity regions 906 are provided between the impurity regions 906 and the channel formation region. The impurity regions function as LDD regions or extension regions for controlling the distribution of electric fields in the vicinity of the channel formation region, depending on the concentration of an impurity introduced thereto. Sidewall insulating films 909 are provided at side surfaces of the gate electrode layer 908 with an insulating film placed therebetween. By using this insulating film and the sidewall insulating films 909, the LDD regions or extension regions can be formed.

The transistor 901 is covered with an insulating film 910. The insulating film 910 can function as a protective film and can prevent impurities from entering the channel formation region from the outside. With the insulating film 910 formed by CVD using a material such as silicon nitride, hydrogenation can be performed by heat treatment in the case where single crystal silicon is used for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and a surface of the insulating film 911 is planarized by CMP. Consequently, element layers can be stacked with high accuracy above a layer including the transistor 901.

A layer including the transistor 902 in which an oxide semiconductor film is used for a channel is formed above the layer including the transistor 901. The transistor 902 is a top-gate transistor. The transistor 902 includes a source electrode layer 927 and a drain electrode layer 928 in contact with side surfaces and an upper surface of an oxide semiconductor film 926, and includes a gate electrode layer 930 over a gate insulating film 929 placed over the oxide semiconductor film 926, the source electrode layer 927, and the drain electrode layer 928. Insulating films 932 and 933 are formed to cover the transistor 902. Here, a method of fabricating the transistor 902 will be described below.

The oxide semiconductor film 926 is formed over the insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. In particular, the insulating film 924 is preferably formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than a dense insulating film, parasitic capacitance due to electrodes or wirings can be further reduced. In this example, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is greater than 2 nm to 200 nm, preferably 3 nm to 50 nm, more preferably 3 nm to 20 nm. The oxide semiconductor film is formed by sputtering using an oxide semiconductor target. Moreover, the oxide semiconductor film can be formed by sputtering under a rare gas (e.g., argon) atmosphere, an oxygen atmosphere, or a mixed atmosphere of a rare gas (e.g., argon) and oxygen.

Note that before the oxide semiconductor film is formed by sputtering, dust on a surface of the insulating film 924 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In this example, an In—Ga—Zn-based oxide semiconductor thin film that has a thickness of 30 nm and is obtained by sputtering using a target including indium (In), gallium (Ga), and zinc (Zn) is used as the oxide semiconductor film. As the target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is 90% or higher and 100% or lower, and preferably 95% or higher and lower than 100%. With the use of the target with high filling rate, a dense oxide semiconductor film is formed.

In the case where an In—Zn-based material is used for the oxide semiconductor film, a target to be used has a composition ratio of In:Zn=50:1 to 1:2 in an atomic ratio ($In_2O_3$: ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=15:1 to 1.5:1 in an atomic ratio ($In_2O_3$:ZnO=15:2 to 3:4 in a molar ratio). For example, in a target used for formation of an In—Zn-based oxide semiconductor with an atomic ratio of In:Zn:O=X:Y:Z, the relation of Z>1.5X+Y is satisfied. The mobility can be improved by keeping the ratio of Zn within the above range.

In the case where an In—Sn—Zn-based oxide semiconductor film is formed as the oxide semiconductor film by sputtering, it is preferable to use an In—Sn—Zn—O target having an atomic ratio of In:Sn:Zn=1:1:1, 2:1:3, 1:2:2, or 20:45:35.

In this example, the oxide semiconductor film is formed in such a manner that the substrate is held in a treatment chamber kept in a reduced pressure state, a sputtering gas from which hydrogen and moisture are removed is introduced while moisture remaining in the treatment chamber is removed, and the above-described target is used. The substrate temperature during the film formation may be 100° C. to 600° C., preferably 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), and the like are removed, whereby the impurity concentration in the oxide semiconductor film formed in the treatment chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferably used because dust generated in deposition can be reduced and the film thickness can be made uniform.

By setting the leakage rate of the treatment chamber of the sputtering apparatus to $1 \times 10^{-10}$ Pa·m³/s or less, impurities, such as an alkali metal or a hydride, which enter the oxide semiconductor film that is being formed by sputtering can be reduced. Further, with the use of an entrapment vacuum pump as an exhaustion system, counter flow of impurities such as an alkali metal, a hydrogen atom, a hydrogen molecule, water, or a hydride from the exhaustion system can be reduced.

When the purity of the target is set to 99.99% or higher, an alkali metal, a hydrogen atom, a hydrogen molecule, water, a hydroxyl group, a hydride, or the like entering the oxide semiconductor film can be reduced. In addition, when the above target is used, the concentration of an alkali metal such as lithium, sodium, or potassium can be reduced in the oxide semiconductor film.

In order that the oxide semiconductor film contains hydrogen, a hydroxyl group, and moisture as little as possible, it is preferable that impurities such as moisture or hydrogen that are adsorbed on the substrate 900 be desorbed and exhausted by preheating of the substrate 900 over which the insulating film 924 is formed in a preheating chamber of a sputtering apparatus, as pretreatment for deposition. The temperature for the preheating is 100° C. to 400° C., preferably 150° C. to 300° C. As an evacuation unit provided in the preheating chamber, a cryopump is preferably used. Note that this preheating treatment can be omitted.

Note that etching for forming the oxide semiconductor film 926 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride ($CF_4$), sulfur hexafluoride ($SF_6$), nitrogen trifluoride ($NF_3$), or trifluoromethane (CHF$_3$)), hydrogen bromide (HBr), oxygen (O$_2$), any of these gases to which a rare gas such as helium (He) or argon (Ar) is added, or the like.

As the dry etching method, a parallel plate reactive ion etching (RIE) method or an inductively coupled plasma (ICP) etching method can be used. In order to etch the film into a desired shape, the etching conditions (e.g., the electric power applied to a coiled electrode, the electric power applied to an electrode on the substrate side, and the electrode temperature on the substrate side) are adjusted as appropriate.

A resist mask used for forming the oxide semiconductor film 926 may be formed by an inkjet method. Formation of the resist mask by an inkjet method needs no photomask; thus, fabrication cost can be reduced.

Note that it is preferable that reverse sputtering be performed before the formation of a conductive film in a subsequent step so that a resist residue and the like that attach onto surfaces of the oxide semiconductor film 926 and the insulating film 924 are removed.

Note that the oxide semiconductor film formed by sputtering or the like sometimes contains a large amount of moisture or hydrogen (including a hydroxyl group) as impurities. Moisture or hydrogen easily forms donor levels and thus serves as impurities in the oxide semiconductor. Therefore, in this example of the present invention, in order to reduce impurities such as moisture and hydrogen in the oxide semiconductor film (dehydrate or dehydrogenate the oxide semiconductor film), the oxide semiconductor film 926 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, more preferably 10 ppb or less, in the case where the measurement is performed by a dew point meter of a cavity ring down laser spectroscopy (CRDS) system).

By performing heat treatment on the oxide semiconductor film 926, moisture or hydrogen in the oxide semiconductor film 926 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this example, an electric furnace that is one of heat treatment apparatuses is used.

Note that the heat treatment apparatus is not limited to an electric furnace, and may have a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Through the above-described steps, the concentration of hydrogen in the oxide semiconductor film 926 can be reduced and the oxide semiconductor film 926 can be highly purified. Thus, the oxide semiconductor film can be stable. In addition, by using the oxide semiconductor film in which the hydrogen concentration is reduced and the purity is improved, it is possible to fabricate a transistor with high withstand voltage and extremely low off-state current. The above heat treatment can be performed at any time after the oxide semiconductor film is formed.

Next, the source electrode layer 927 and the drain electrode layer 928 are formed by a photolithography process. Specifically, the source electrode layer 927 and the drain electrode layer 928 can be formed in such a manner that a conductive film is formed over the insulating film 924 by sputtering or vacuum evaporation and then processed (patterned) into a predetermined shape.

In this example, a 100-nm-thick tungsten film is used for the source electrode layer 927 and the drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partially etched and thus a groove (a depressed portion) is formed in some cases.

In this example, a tungsten film is used as the conductive film to be the source electrode layer 927 and the drain electrode layer 928. Thus, wet etching can be selectively performed on the conductive film using a solution containing ammonia and hydrogen peroxide water (an ammonia hydrogen peroxide mixture). As the ammonia hydrogen peroxide mixture, a solution in which 31 wt % hydrogen peroxide water, 28 wt % ammonia water, and water are mixed at a volume ratio of 5:2:2 is specifically used. Alternatively, dry etching may be performed on the conductive film with the use of a gas containing carbon tetrafluoride (CE), chlorine (Cl$_2$), or oxygen.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by ashing; thus, the resist mask can be used in a plurality of etching steps for processing films into different patterns. Thus, a resist mask corresponding to at least two kinds of different patterns can be formed by one multi-tone mask. As a result, the number of light-exposure masks can be reduced and the number of corresponding photolithography processes can also be reduced, whereby the fabrication process can be simplified.

Further, an oxide conductive film functioning as a source region and a drain region may be provided between the oxide semiconductor film 926 and the source and drain electrode layers 927 and 928. The material of the oxide conductive film preferably contains zinc oxide as a component and preferably does not contain indium oxide. For such an oxide conductive film, zinc oxide, zinc aluminum oxide, zinc aluminum oxynitride, zinc gallium oxide, or the like can be used.

For example, in the case where the oxide conductive film is formed, patterning for forming the oxide conductive film and patterning for forming the source electrode layer 927 and the drain electrode layer 928 may be performed concurrently.

By providing the oxide conductive film functioning as the source and drain regions, the resistance between the oxide semiconductor film 926 and the source and drain electrode layers 927 and 928 can be lowered, so that the transistor can operate at high speed. In addition, with provision of the oxide conductive film functioning as the source and drain regions, the withstand voltage of the transistor can be increased.

Next, plasma treatment may be performed using a gas such as $N_2O$, $N_2$, or Ar. By this plasma treatment, water or the like attached onto an exposed surface of the oxide semiconductor film is removed. Plasma treatment may be performed using a mixture gas of oxygen and argon.

After the plasma treatment, the gate insulating film 929 is formed to cover the source and drain electrode layers 927 and 928 and the oxide semiconductor film 926. Then, over the gate insulating film 929, the gate electrode layer 930 is formed to overlap with the oxide semiconductor film 926.

In this example, a 20-nm-thick silicon oxynitride film formed by sputtering is used as the gate insulating film 929. The substrate temperature during the film formation may range from room temperature to 400° C. and is 300° C. in this example.

After the gate insulating film 929 is formed, heat treatment may be performed. The heat treatment is performed in a nitrogen atmosphere, ultra-dry air, or a rare gas (e.g., argon or helium) atmosphere preferably at 200° C. to 400° C., and for example at 250° C. to 350° C. It is preferable that the water content in the gas be 20 ppm or less, preferably 1 ppm or less, more preferably 10 ppb or less. In this example, for example, heat treatment is performed in a nitrogen atmosphere at 250° C. for 1 hour. Alternatively, RTA treatment for a short time at a high temperature may be performed before the formation of the source and drain electrode layers 927 and 928 in a manner similar to that of the heat treatment performed on the oxide semiconductor film for reduction of moisture or hydrogen. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be satisfied. As a result, the oxide semiconductor film 926 can be made to be substantially i-type and variations in electrical characteristics of the transistor due to oxygen vacancies can be reduced; thus, electrical characteristics can be improved. There is no particular limitation on the timing of this heat treatment as long as it is after the formation of the gate insulating film 929. When this heat treatment doubles as another step, the oxide semiconductor film 926 can be made to be substantially i-type without increase in the number of steps.

Moreover, oxygen vacancies that serve as donors in the oxide semiconductor film 926 may be reduced by subjecting the oxide semiconductor film 926 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (i.e., the impurity concentration in the oxygen gas is preferably 1 ppm or lower, more preferably 0.1 ppm or lower).

Alternatively, oxygen may be added to the oxide semiconductor film 926 by ion implantation, ion doping, or the like to reduce oxygen vacancies serving as donors. For example, oxygen that is made into a plasma state with a microwave at 2.45 GHz may be added to the oxide semiconductor film 926.

The gate electrode layer 930 can be formed in such a manner that a conductive film is formed over the gate insulating film 929 and then is patterned.

The thickness of the gate electrode layer 930 is 10 nm to 400 nm, preferably 100 nm to 300 nm. In this example, the gate electrode layer 930 is formed in the following manner: a 135-nm-thick tungsten film is stacked over a 30-nm-thick tantalum nitride film by sputtering to form a conductive film for the gate electrode, and then, the conductive film is processed (patterned) into a desired shape by etching. Note that a resist mask may be formed by an inkjet method. Formation of the resist mask by an inkjet method needs no photomask; thus, fabrication cost can be reduced.

Through the above steps, the transistor 902 is formed.

Note that the transistor 902 is described as a single-gate transistor; if necessary, it is possible to fabricate a multi-gate transistor that includes a plurality of gate electrodes electrically connected to each other and thus includes a plurality of channel formation regions.

In the fabrication method described above, the source electrode layer 927 and the drain electrode layer 928 are formed after the oxide semiconductor film 926. Accordingly, as illustrated in FIG. 4, in the transistor 902 obtained by the above-described method, the source electrode layer 927 and the drain electrode layer 928 are formed over the oxide semiconductor film 926. Alternatively, in the transistor 902, the source and drain electrode layers 927 and 928 may be formed below the oxide semiconductor film 926, that is, between the oxide semiconductor film 926 and the insulating film 924.

Note that an insulating film in contact with the oxide semiconductor film 926 may be formed using an insulating material containing an element that belongs to Group 13 and oxygen. Many of oxide semiconductor materials contain a Group 13 element, and an insulating material containing a Group 13 element is compatible with an oxide semiconductor. Thus, when an insulating material containing a Group 13 element is used for the insulating film in contact with the oxide semiconductor film, the state of the interface between the oxide semiconductor film and the insulating film can be kept favorable.

An insulating material containing a Group 13 element is an insulating material containing one or more elements that belong to Group 13. As the insulating material containing a Group 13 element, gallium oxide, aluminum oxide, aluminum gallium oxide, gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor film containing gallium, a material containing gallium oxide may be used for the insulating film, so that favorable characteristics can be kept at the interface between the oxide semiconductor film and the insulating film. For example, the oxide semiconductor film and an insulating film containing gallium oxide are provided in contact with each other, so that pileup of hydrogen at the interface between the oxide semiconductor film and the insulating film can be reduced. Note that a similar effect can be obtained in the case where an element in the same group as a constituent element of the oxide semiconductor is used in the insulating film. For example, it is effective to form an insulating film with the use of a material containing aluminum oxide. Note that water is less likely to permeate aluminum oxide, and it is therefore preferable to use a material containing aluminum oxide in terms of preventing entry of water to the oxide semiconductor film.

The insulating film which is in contact with the oxide semiconductor film 926 preferably contains oxygen in a proportion higher than the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

By oxygen doping, an insulating film that includes a region where the proportion of oxygen is higher than that in the stoichiometric composition can be formed. When the insulating film including such a region is in contact with the oxide semiconductor film, excess oxygen in the insulating film is supplied to the oxide semiconductor film, and oxygen vacancies in the oxide semiconductor film or at the interface between the oxide semiconductor film and the insulating film are reduced. Thus, the oxide semiconductor film can be made to be i-type or substantially i-type.

Note that the insulating film including a region where the proportion of oxygen is higher than that in the stoichiometric composition may be used as either the insulating film placed above the oxide semiconductor film 926 or the insulating film placed below the oxide semiconductor film 926 of the insulating films in contact with the oxide semiconductor film 926; however, it is preferable to use such an insulating film as both of the insulating films in contact with the oxide semiconductor film 926. The above-described effect can be enhanced with a structure in which the insulating films each including a region where the proportion of oxygen is higher than that in the stoichiometric composition are used as the insulating films in contact with the oxide semiconductor film 926 and positioned above and below the oxide semiconductor film 926 so that the oxide semiconductor film 926 is sandwiched between the insulating films.

The constituent elements may be the same or different between the insulating films placed above and below the oxide semiconductor film 926. The insulating film in contact with the oxide semiconductor film 926 may be a stack of insulating films each including a region where the proportion of oxygen is higher than that in the stoichiometric composition.

Note that in this example, the transistor 902 has a top-gate structure. The transistor 902 includes a backgate electrode layer 923. The provision of the backgate electrode layer allows the transistor 902 to obtain normally-off characteristics. For example, when the potential of the backgate electrode layer 923 is set at GND or a fixed potential, the threshold voltage of the transistor 902 can shift further in a positive direction, which leads to the formation of a normally-off transistor.

In order to electrically connect the transistor 901 and the transistor 902 to form an electric circuit, one or more wiring layers for connecting these elements are stacked between layers and on the upper layer.

In FIG. 4, for example, one of the source and the drain of the transistor 901 is electrically connected to a wiring layer 914 through the contact plug 913. The other of the source and the drain of the transistor 901 is electrically connected to a wiring layer 916 through the contact plug 915. The gate of the transistor 901 is electrically connected to the drain electrode layer 928 of the transistor 902 through a contact plug 917, a wiring layer 918, a contact plug 921, a wiring layer 922, and a contact plug 925.

The wiring layers 914, 916, 918, and 922, and the backgate electrode layer 923 are embedded in insulating films. These wiring layers and the like are preferably formed using a low-resistance conductive material such as copper or aluminum. Alternatively, the wiring layers can be formed using graphene formed by CVD as a conductive material. Graphene is a one-atom thick sheet of $sp^2$-bonded carbon molecules or a stack of 2 to 100 sheets of the carbon molecules. Examples of a method of manufacturing such graphene are thermal CVD by which graphene is formed on a metal catalyst; and plasma CVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is independently formed, or may be formed in such a manner that a material of the barrier film is included in a wiring material and precipitated by heat treatment on the inner wall of an opening provided in an insulating film.

The insulating films 911, 912, 919, 920, and 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide prepared from $Si(OC_2H_5)_4$, hydrogen silsesquioxane (HSQ), methyl silsesquioxane (MSQ), organosilicate glass (OSG), or an organic polymer-based material. In particular, in the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. In addition, since CMP treatment is performed after the wirings are embedded in the insulating films, the insulating films need to have high mechanical strength. The insulating films can be made porous to have a lower dielectric constant as long as their mechanical strength can be secured. The insulating films are formed by sputtering, CVD, a coating method including spin coating (also referred to as spin on glass (SOG)), or the like.

An insulating film functioning as an etching stopper for planarization treatment by CMP or the like that is performed after the wiring material is embedded in the insulating films 911, 912, 919, 920, and 933 may be additionally provided.

Each of the contact plugs 913, 915, 917, 921, and 925 is formed in such a manner that an opening (a via hole) with a high aspect ratio is formed in the insulating film and is filled with a conductive material such as tungsten. The opening is formed preferably by highly anisotropic dry etching and particularly preferably by reactive ion etching (RIE). The inner wall of the opening is covered with a barrier film (diffusion prevention film) formed of a titanium film, a titanium nitride film, a stack of such films, or the like, and a material such as tungsten or polysilicon doped with phosphorus or the like fills the opening. For example, the via hole is filled with tungsten by blanket CVD, and an upper surface of the contact plug is planarized by CMP.

Example 2

The semiconductor device of one embodiment of the present invention can be used for electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the semiconductor device of one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 5A to 5F illustrate specific examples of these electronic devices.

Figure 5A:
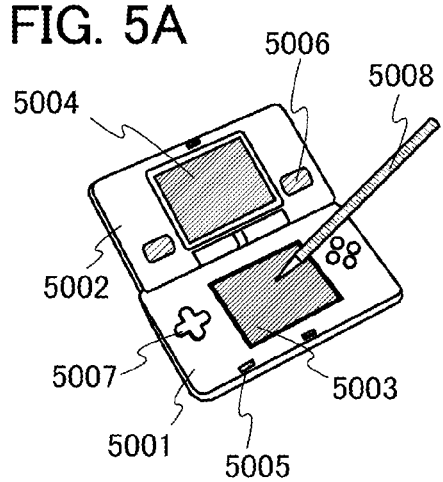
FIGS. 5A to 5F each illustrate a specific example of an electronic device.

FIG. 5A illustrates a portable game console. The portable game console illustrated in FIG. 5A includes a housing 5001, a housing 5002, a display portion 5003, a display portion 5004, a microphone 5005, a speaker 5006, an operation key 5007, a stylus 5008, and the like. Note that although the portable game console illustrated in FIG. 5A has the two display portions 5003 and 5004, the number of display portions included in the portable game console is not limited to two.

Figure 5B:
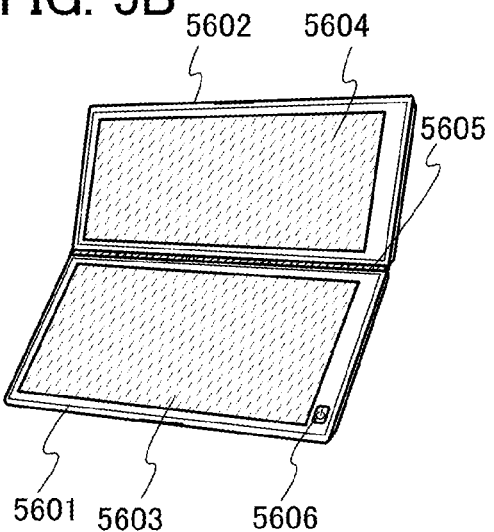

FIG. 5B illustrates a portable information terminal. The portable information terminal illustrated in FIG. 5B includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched depending on the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel area of a display device.

Figure 5C:
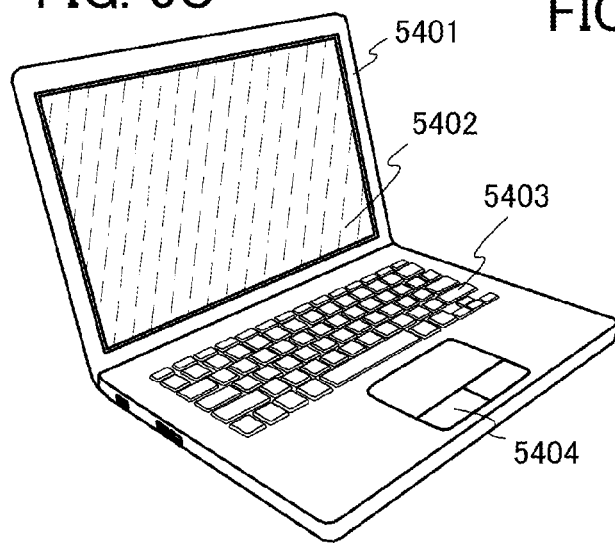

FIG. 5C illustrates a laptop personal computer. The laptop personal computer illustrated in FIG. 5C includes a housing 5401, a display portion 5402, a keyboard 5403, a pointing device 5404, and the like.

Figure 5D:
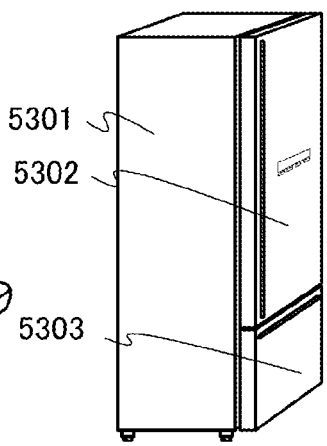

FIG. 5D illustrates an electric refrigerator-freezer. The electric refrigerator-freezer illustrated in FIG. 5D includes a housing 5301, a refrigerator door 5302, a freezer door 5303, and the like.

Figure 5E:
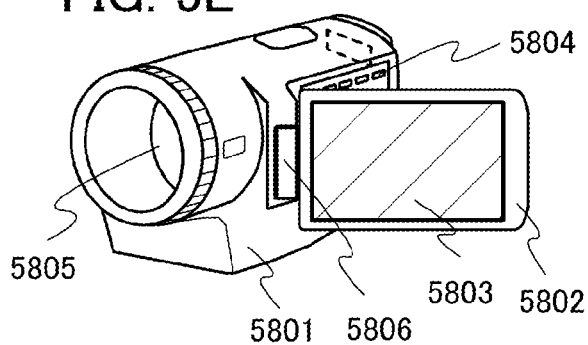

FIG. 5E illustrates a video camera. The video camera illustrated in FIG. 5E includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched depending on the angle at the joint 5806 between the first housing 5801 and the second housing 5802.

Figure 5F:
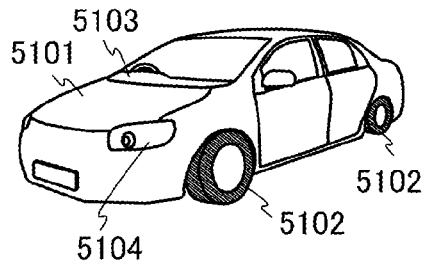

FIG. 5F illustrates a passenger car. The passenger car illustrated in FIG. 5F includes a car body 5101, wheels 5102, a dashboard 5103, lights 5104, and the like.

This application is based on Japanese Patent Application serial no. 2012-152338 filed with Japan Patent Office on Jul. 6, 2012, the entire contents of which are hereby incorporated by reference.

What is claimed is:
1. A semiconductor device comprising:
an arithmetic portion including a first node and a second node;
a third node;
a fourth node;
a first transistor including a channel in an oxide semiconductor layer;
a second transistor including a channel in an oxide semiconductor layer; and
a comparator comprising a third transistor including a channel in a silicon wafer or a silicon film,
wherein one of a source and a drain of the first transistor is electrically connected to the first node,
wherein the other of the source and the drain of the first transistor is electrically connected to the third node,
wherein one of a source and a drain of the second transistor is electrically connected to the second node,
wherein the other of the source and the drain of the second transistor is electrically connected to the fourth node,
wherein a non-inverting input terminal of the comparator is electrically connected to the third node,
wherein an inverting input terminal of the comparator is electrically connected to the fourth node,
wherein an output terminal of the comparator is electrically connected to the arithmetic portion,
wherein an insulating film is over the third transistor, and
wherein the first transistor and the second transistor are over the insulating film.
2. The semiconductor device according to claim 1,
wherein the first node is configured to hold a potential corresponding to one of 1 and 0 as data,
wherein the second node is configured to hold a potential corresponding to the other of 1 and 0 as inverted data,
wherein the third node is configured to hold the potential corresponding to the one of 1 and 0 as the data, and wherein the fourth node is configured to hold the potential corresponding to the other of 1 and 0 as the inverted data.

3. The semiconductor device according to claim 1 further comprising a first capacitor and a second capacitor,
wherein a first terminal of the first capacitor is electrically connected to the third node,
wherein a first terminal of the second capacitor is electrically connected to the fourth node,
wherein the first capacitor is configured to hold the potential corresponding to the one of 1 and 0 as the data, and
wherein the second capacitor is configured to hold the potential corresponding to the other of 1 and 0 as the inverted data.

4. The semiconductor device according to claim 3 further comprising a first wiring and a second wiring,
wherein the first wiring is electrically connected to a second terminal of the first capacitor and a second terminal of the second capacitor, and
wherein the second wiring is electrically connected to a gate of the first transistor and a gate of the second transistor.

5. A semiconductor device comprising:
an arithmetic portion;
a first transistor including a channel in an oxide semiconductor layer;
a second transistor including a channel in an oxide semiconductor layer;
a comparator comprising a third transistor including a channel in a silicon wafer or a silicon film;
a first capacitor;
a second capacitor; and
a first wiring,
wherein one of a source and a drain of the first transistor is electrically connected to a first terminal of the arithmetic portion,
wherein one of a source and a drain of the second transistor is electrically connected to a second terminal of the arithmetic portion,
wherein the other of the source and the drain of the first transistor is electrically connected to a first terminal of the first capacitor,
wherein the other of the source and the drain of the second transistor is electrically connected to a first terminal of the second capacitor,
wherein the first wiring is electrically connected to a second terminal of the first capacitor and a second terminal of the second capacitor,
wherein a non-inverting input terminal of the comparator is electrically connected to the other of the source and the drain of the first transistor and the first terminal of the first capacitor,
wherein an inverting input terminal of the comparator is electrically connected to the other of the source and the drain of the second transistor and the first terminal of the second capacitor,
wherein an output terminal of the comparator is electrically connected to the first terminal of the arithmetic portion,
wherein the first capacitor is configured to hold a potential corresponding to one of 1 and 0 as data,
wherein the second capacitor is configured to hold a potential corresponding to the other of 1 and 0 as inverted data,
wherein an insulating film is over the third transistor, and
wherein the first transistor and the second transistor are over the insulating film.

6. The semiconductor device according to claim 5 further comprising a second wiring,
wherein the second wiring is electrically connected to a gate of the first transistor and a gate of the second transistor.

7. A method of driving a semiconductor device, the semiconductor device comprising:
a first node in which a potential corresponding to one of 1 and 0 is held as data in a period in which a power source voltage is supplied;
a second node in which a potential corresponding to the other of 1 and 0 is held as inverted data in the period in which the power source voltage is supplied;
a third node in which the data is held regardless of whether the power source voltage is supplied or not;
a fourth node in which the inverted data is held regardless of whether the power source voltage is supplied or not;
a first transistor configured to control electrical connection between the first node and the third node, the first transistor including a channel in an oxide semiconductor layer;
a second transistor configured to control electrical connection between the second node and the fourth node, the second transistor including a channel in an oxide semiconductor layer; and
a comparator to which a potential of the third node is input as a first input signal and a potential of the fourth node is input as a second input signal,
the method of driving the semiconductor device comprising:
a first step of storing the data, which is held in the first node, in the third node by turning on the first transistor and storing the inverted data, which is held in the second node, in the fourth node by turning on the second transistor;
a second step of stopping supply of the power source voltage after the first step;
a third step of starting the supply of the power source voltage after the second step; and
a fourth step of restoring the data in the first node and the inverted data in the second node which are held before the second step, in accordance with an output signal of the comparator after the third step,
wherein the comparator comprises a third transistor including a channel in a silicon wafer or a silicon film,
wherein an insulating film is over the third transistor, and
wherein the first transistor and the second transistor are over the insulating film.

* * * * *